United States Patent

Yamatani

[11] 4,048,569
[45] Sept. 13, 1977

[54] RECEIVER AUTOMATIC GAIN CONTROL SYSTEM

[75] Inventor: Wataru Yamatani, Hatogayashi, Japan

[73] Assignee: Sony Corporation, Tokyo, Japan

[21] Appl. No.: 671,393

[22] Filed: Mar. 29, 1976

[30] Foreign Application Priority Data

Apr. 9, 1975    Japan .................................. 50-43033

[51] Int. Cl.² ............................................. H04B 1/16
[52] U.S. Cl. .................... 325/414; 325/405; 325/408; 325/415; 325/319; 330/138
[58] Field of Search ............... 325/400, 404, 405, 408, 325/411, 414, 415, 413, 319; 330/135, 136, 138

[56] References Cited

U.S. PATENT DOCUMENTS

| | | | |
|---|---|---|---|
| 2,279,128 | 4/1942 | Paslay | 325/414 |
| 2,949,533 | 8/1960 | Read | 325/411 |
| 3,303,428 | 2/1967 | Zentmaier et al. | 325/414 |
| 3,490,046 | 1/1970 | Russell | 325/411 |
| 3,571,719 | 3/1971 | Beary | 325/408 |

Primary Examiner—Benedict V. Safourek
Assistant Examiner—Tommy P. Chin
Attorney, Agent, or Firm—Hill, Gross, Simpson, Van Santen, Steadman, Chiara & Simpson

[57] ABSTRACT

A receiver with an automatic gain control system is disclosed in which the signal path between the output coil of an antenna tuning coil and a first stage of a circuit supplied with a received signal from the antenna tuning coil is connected in parallel with a plurality of variable impedance elements, resistors are connected in series between at least the plurality of variable impedance elements, and an automatic gain control signal is supplied to the plurality of variable impedance elements to thereby perform an automatic gain control.

5 Claims, 2 Drawing Figures

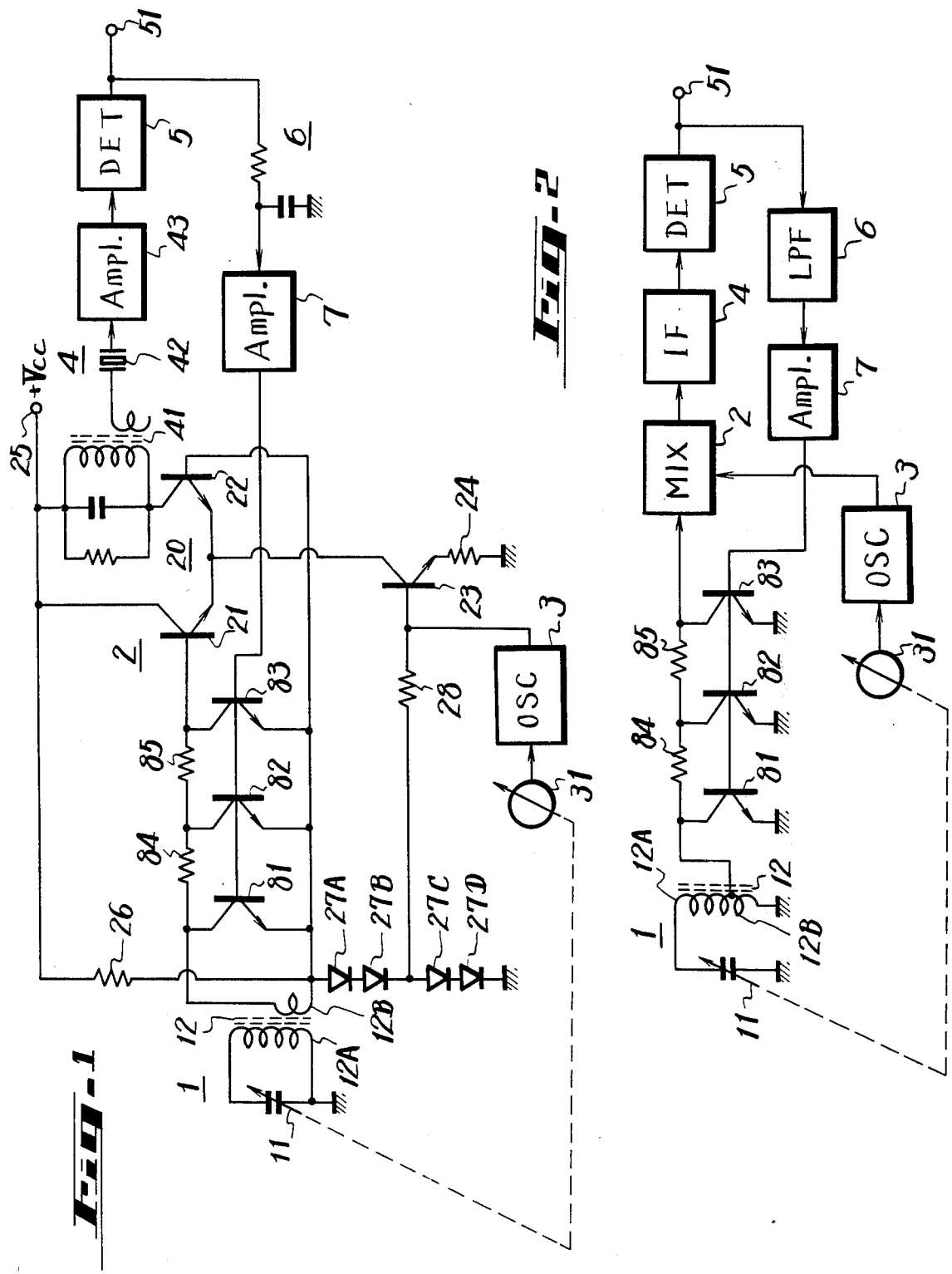

RECEIVER AUTOMATIC GAIN CONTROL SYSTEM

BACKGROUND OF THE INVENTION

1. Field of the Invention

This invention relates generally to a receiver, and more particularly to a receiver having improved automatic gain control characteristics.

2. Description of the Prior Art

In the prior art, a receiver for amplitude modulated signals usually includes an automatic gain control system which keeps the output signal of the receiver relatively constant despite variations in signal strength at the antenna of the receiver. The automatic gain control system makes it possible to tune from a weak signal to a strong signal without having the audio output become inordinately loud. In other words, it is important for a receiver to automatically vary the gain of the receiver in such a manner that the receiver will receive a weak signal with high sensitivity but a strong signal with low sensitivity.

In general, an automatic gain control system used in a prior art receiver carries out its automatic gain control operation by rectifying an audio signal and controlling the gain of, for example, an RF (radio frequency) signal amplifier or IF (intermediate frequency) signal amplifier with the rectified audio signal. In a transistorized receiver, the above rectified output signal is supplied to the base bias circuit for the transistor which forms an amplifier to vary the base bias of the transistor and hence to control the gain of the amplifier.

In an IF stage in which a pair of transistors form a differential amplifier, a gain control signal is applied to the base electrodes of the pair of transistors or to the base electrode of a transistor which forms a constant current circuit. In many cases, however, an amplifier whose gain is to be controlled has connected, at its input side, a resistor which forms a voltage dividing circuit together with a variable impedance element whose impedance varies when a gain control signal is applied to the input side of the amplifier. The resistor is desired to be omitted when automatic gain control operation is not performed, because the resistor causes undesired power consumption and signal loss.

SUMMARY OF THE INVENTION

It is an object of the present invention to provide a receiver having a novel gain control system.

It is another object of the invention to provide a receiver in which a resistor low in resistance value is connected to the input side of an amplifier having gain to be automatically controlled, and a variable impedance element is connected to one side of the resistor to form a voltage divider stage.

It is a further object of the invention to provide a receiver in which a plurality of variable impedance elements having impedances which are varied by a gain control signal, and a plurality of resistors form voltage dividing circuits so that the range of an automatic gain control is widened.

It is a further object of the invention to provide a receiver in which an automatic gain control circuit is formed by a resistor and a transistor, the impedance between emitter and collector electrodes of which is varied by a gain control signal and which is advantageous when an integrated circuit is used.

It is a further object of the invention to provide a receiver which is provided with an automatic gain control system having a gain control range which can be widened by a simple circuit.

It is yet another object of the invention to provide a receiver in which a combination of a resistor low in resistance value and a transistor, having an impedance which is varied by a gain control signal, is connected to the input stage of a differential amplifier formed of a pair of transistors. An input signal from an antenna is supplied through the above resistor to the differential amplifier, which is also supplied with a signal from a local oscillator.

It is another object of the invention to provide an AGC circuit which is suitable for an integrated circuit.

The other objects, features and advantages of the invention will become apparent from the following description taken in conjunction with the accompanying drawings.

BRIEF DESCRIPTION OF THE DRAWINGS

FIG. 1 is a schematic circuit diagram showing an embodiment of the receiver automatic gain control system according to the invention; and FIG. 2 is a schematic circuit diagram showing another embodiment of the invention.

DESCRIPTION OF THE PREFERRED EMBODIMENTS

An embodiment of the receiver automatic gain control system according to the present invention will be now described with reference to FIG. 1.

In the embodiment of FIG. 1, an antenna tuning circuit consists of an antenna tuning varicon (variable capacitor) 11 and an input coil 12A of an antenna tuning coil 12. This antenna tuning coil 12 includes an output coil 12B which is connected to a mixer circuit 2. This mixer circuit 2 is formed of a differential amplifier 20 in the illustrated example. That is, the emitter electrodes of a pair of transistors 21 and 22 are connected together to the collector electrode of a transistor 23 as a constant current source, the emitter electrode of the transistor 23 is grounded through a resistor 24, and the collector electrode of the transistor 21 is connected to a power source terminal 25 of $+V_{CC}$ to form the differential amplifier 20. One end of the output coil 12B is connected to the base electrode of the transistor 21 through resistors 84 and 85 which will be described later, while the other end of the output coil 12B is connected to the base electrode of the transistor 22. Between the terminal 25 and the ground there is connected a series connection of a resistor 26 and diodes 27A, 27B, 27C and 27D. The connection point between the resistor 26 and the diode 27A is connected to the base electrode of the transistor 22, and the connection point between the diodes 27B and 27C is connected through a resistor 28 to the base electrode of the transistor 23. The collector electrode of the transistor 22 is connected to the terminal 25 through an intermediate frequency transformer 41 of an intermediate frequency circuit 4. A local oscillator circuit 3 is provided which supplies its oscillation output signal to the base electrode of the transistor 23. The local oscillator 3 is provided with a resonance circuit 31 which is ganged with the varicap 11.

The received signal selected by the antenna tuning circuit 1 is frequency-converted by the mixer circuit 2, with the local oscillation signal from the local oscillator 3, into an intermediate frequency signal. This produced intermediate frequency signal is supplied from the intermediate frequency transformer 41 through a ceramic filter 42 to an amplifier 43 to be amplified and then the amplified signal is supplied to a detector circuit 5 to be detected. The detected output signal from the detector circuit 5 is delivered to an output terminal 51.

In the circuit shown in FIG. 1, an automatic gain control circuit is provided which consists mainly of three transistors 81, 82 and 83. In detail, the collector-emitter path of the transistor 81 is connected in parallel to the output coil 12B; a series connection of the receiver 84 and the collector-emitter path of the transistor 82 is connected in parallel to the collector-emitter path of the transistor 81; a series connection of the resistor 85 and the collector-emitter path of the transistor 83 is connected in parallel to the collector-emitter path of the transistor 82; and the collector electrode of the transistor 83 is connected to the base electrode of the transistor 21. The detected output signal from the detector circuit 5 is supplied further to a low pass filter 6 which produces a direct current signal or direct current signal with the level corresponding to the input level of the broadcasting signal (received level) contained in the detected output signal. The direct current signal from the low pass filter 6 is fed to an amplifier 7 and then the amplified signal is fed to the base electrodes of the transistors 81 to 83 as an automatic gain control signal. In this case, the resistance value of the resistors 84 and 85 is selected to reduce power loss in view of alternating and direct currents when the transistors 81 to 83 are OFF (for example, 100Ω).

With the receiver of the present invention constructed as above, as the input level of the broadcasting signal becomes high, the level of the direct current signal from the low pass filter 6 becomes high and the impedances between the collector and emitter electrodes of the transistors 81 to 83 become low. In this case, since three attenuator stages formed by the output impedance of the coil 12B, resistors 84 and 85, and transistors 81 to 83, the level of the received signal applied to the base electrodes of the transistors 21, 22 becomes low and, accordingly, the level of the detected output signal delivered to the output terminal 51 is made constant regardless of the input level.

In the receiver of the invention shown in FIG. 1, attenuators in three stages are provided to control the level of the received signal, so that the range of the automatic gain control can be made sufficiently wide. According to experiments, the range of the automatic gain control of the invention can be widened by 10 to 20 dB as compared with the case where only the transistor 81 is used or the resistors 84 and 85 are omitted. Further, in this case since the circuit is a simple combination of resistors and transistors, it is very useful for use with a receiver which is made of an integrated circuit.

FIG. 2 shows another embodiment of the invention in which reference numerals which are the same as those used in FIG. 1, designate the same components and elements.

In the receiver of the invention shown in FIG. 2, a part of the input coil 12A of the antenna tuning coil 12 is utilized as the output coil 12B. The automatic gain control system is the same as that shown in FIG. 1 and is also adopted in this example. Further, it is possible to connect a resistor similar to the resistors 84 and 85 between the output coil 12B and the collector electrode of the transistor 81, if necessary.

It will be apparent that many modifications and variations could be effected by one skilled in the art without departing from the spirit or scope of the novel concepts of the present invention.

I claim as my invention:

1. A receiver comprising:
   a. an antenna circuit having a resonance circuit and which produces an electrical signal in response to a broadcasting signal;
   b. automatic gain control coupling means coupled to said resonance circuit and comprising a voltage divider having a plurality of resistive elements connected in series, and a plurality of variable impedance elements connected in parallel and having commonly connected control inputs, each of said variable impedance elements being connected at one end of one of said resistive elements; and
   c. circuit means for amplifying and detecting and for providing a DC signal to said automatic gain control coupling means, said DC signal being directly connected to said variable impedance elements commonly connected control inputs to supply an automatic gain control signal to vary their impedance values.

2. A receiver comprising:
   a. an antenna circuit having a resonance circuit and which produces an electrical signal in response to a broadcasting signal;
   b. automatic gain control coupling means coupled to said resonance circuit and comprising a voltage divider having a plurality of resistive elements connected in series, and a plurality of variable impedance elements connected in parallel, each of said variable impedance elements being connected to one end of one of said resistive elements;
   c. circuit means for amplifying and detecting connected to said automatic gain control coupling means, said circuit being connectd to said variable impedance elements to supply an automatic gain control signal to vary their impedance values; and
   d. said circuit means including a pair of transistors having collectors connected to a potential source, emitter electrodes which are connected together, and which further includes a means for supplying a signal from a local oscillator to said connected together emitter electrodes; and in which each of said variable impedance elements is a transistor having emitter, base and collector electrodes, the emitter-collector paths of said transistors of said variable impedance elements being connected between the base electrodes of said pair of transistors, and said automatic gain control signal is supplied to the base electrodes of said transistors forming said variable impedance elements.

3. A receiver automatic gain control system comprising:
   a. a receiving circuit for producing an electrical signal at an output;
   b. attenuator means connected to said receiving circuit comprising at least two series connected voltage divider stages, each stage having a fixed impedance in series with said receiving circuit output and a three terminal semiconductor device variable impedance in parallel with said receiving circuit output control inputs of said semiconductor device impedance being commonly connected;
   c. an amplifying and detecting means connected to said attenuator means; and d. low pass filter means for providing a DC signal connected to said amplifying and detecting means, said DC signal being directly connected to said commonly connected control inputs of said variable impedances, said DC signal varying the impedance of said variable impedances to produce automatic gain control.

4. The system of claim 3 in which a local oscillator is provided and in which said amplifying means comprises a differential amplifier mixer having two inputs, said inputs being respectively connected to two output terminals of said attenuator means an output of said differential amplifier being connected to said detector means, and said local oscillator being connected to inject a signal into said mixer.

5. The system of claim 3 in which said attenuator means comprises two electrical paths, one path having two series connected fixed impedances, and three variable impedances connected in parallel across said two paths, one of said variable impedances being connected at each end of each fixed impedance, inputs to each of said variable impedances being commonly supplied with the automatic gain control signal from said filter means.

* * * * *